United States Patent [19]

Nakashima et al.

[11] Patent Number: 5,615,157
[45] Date of Patent: Mar. 25, 1997

[54] SEMICONDUCTOR MEMORY TESTING APPARATUS

[75] Inventors: Katsuya Nakashima; Shumpei Kohri, both of Nagasaki, Japan

[73] Assignee: Sony Corporation, Tokyo, Japan

[21] Appl. No.: 499,653

[22] Filed: Jul. 7, 1995

Related U.S. Application Data

[62] Division of Ser. No. 172,271, Dec. 23, 1993, abandoned.

[30] Foreign Application Priority Data

Dec. 25, 1993 [JP] Japan ................................. 4-345777

[51] Int. Cl.$^6$ .................................................. G11C 29/00
[52] U.S. Cl. ........................ 365/201; 365/233; 365/194; 365/236
[58] Field of Search ............................ 365/230.01, 200, 365/201, 205, 189.01, 233, 194, 236

[56] References Cited

U.S. PATENT DOCUMENTS

| 5,025,422 | 6/1991 | Moriwaki et al. | 365/233.5 |
| 5,079,744 | 1/1992 | Tobita et al. | 365/201 |
| 5,400,282 | 3/1995 | Suzuki et al. | 365/201 |

FOREIGN PATENT DOCUMENTS

| 4-252488 | 9/1992 | Japan . |
| 4-351797 | 12/1992 | Japan . |

*Primary Examiner*—Viet Q. Nguyen
*Attorney, Agent, or Firm*—Hill Steadman & Simpson

[57] ABSTRACT

A memory device comprising memory cells associated with word lines for storing data. A timer is connected to determine the length of time during which a selected word line(s) is activated. The word line activation time length is shorter in a testing mode than in a using mode.

1 Claim, 4 Drawing Sheets

SEMICONDUCTOR MEMORY TESTING APPARATUS

This application is a divisional application of Ser. No. 08/172,271 filed on Dec. 23, 1993, now abandoned.

BACKGROUND OF THE INVENTION

This invention relates to a semiconductor memory device arranged to detect a defective part(s).

It is required to test semiconductor memory devices, such as static random access memory (SRAM), dynamic random access memory (DRAM) and the like, before they are forwarded. For example, a PWL timer has been used to determine the length of time during which the associated word line remains at a high level when the reading and/or writing operation of a pulsed word line (PWL) type SRAM is tested. However, such a PWL timer is arranged to determine the same time length regardless of whether it operates in the testing or using mode. For this reason, the possibility exists that some of the forwarded semiconductor devices do not have enough internal timing. Such defective semiconductor devices cannot satisfy specifications with small variations in the transistor characteristics.

SUMMARY OF THE INVENTION

It is a main object of the invention to provide a method and apparatus which can provide certain and easy semiconductor memory testing.

There is provided, in accordance with the invention, a memory device which comprises a memory cell for storing data, a word line related to the memory cell, and a timer defining an active period of the word line. The active period is variable.

In another aspect of the invention, there is provided a memory device which comprises a sense amplifier, a pair of data lines connected to respective inputs of the sense amplifier, a pair of output lines connected to respective outputs of the sense amplifier, a timer is provided for providing first and second equalizing signals, a first equalizer responsive to the first equalizing signal for equalizing the data lines, a second equalizer responsive to the second equalizing signal for equalizing the output lines, and means for varying an interval between the first and second equalizing signals.

In another aspect of the invention, there is provided a method for testing writing and/or reading operation of a memory device. The method comprises causing the memory device writing and/or reading wherein a word line is activated during a shorter period than in a using mode.

In another aspect of the invention, there is provided a method for testing writing and/or reading operation of a memory device. The memory comprises causing the memory device writing and/or reading wherein an interval between equalizing a pair of input lines of a sense amplifier and equalizing a pair of output lines of the sense amplifier is defined shorter than an interval between the same in a using mode.

In still another aspect of the invention, there is provided a method for testing a memory device having a repair fuse connected between a first voltage and a node, first and second transistors connected between the node and a second voltage in parallel with each other wherein said first transistor is responsive to a reset pulse and said second transistor is responsive to a voltage at the node. The method comprises keeping the reset transistor cutting off during detecting whether there is a leakage in the repair fuse.

BRIEF DESCRIPTION OF THE DRAWINGS

This invention will be described in greater detail by reference to the following description taken in connection with the accompanying drawings, in which.

DETAILED DESCRIPTION OF THE INVENTION

Figure 1:
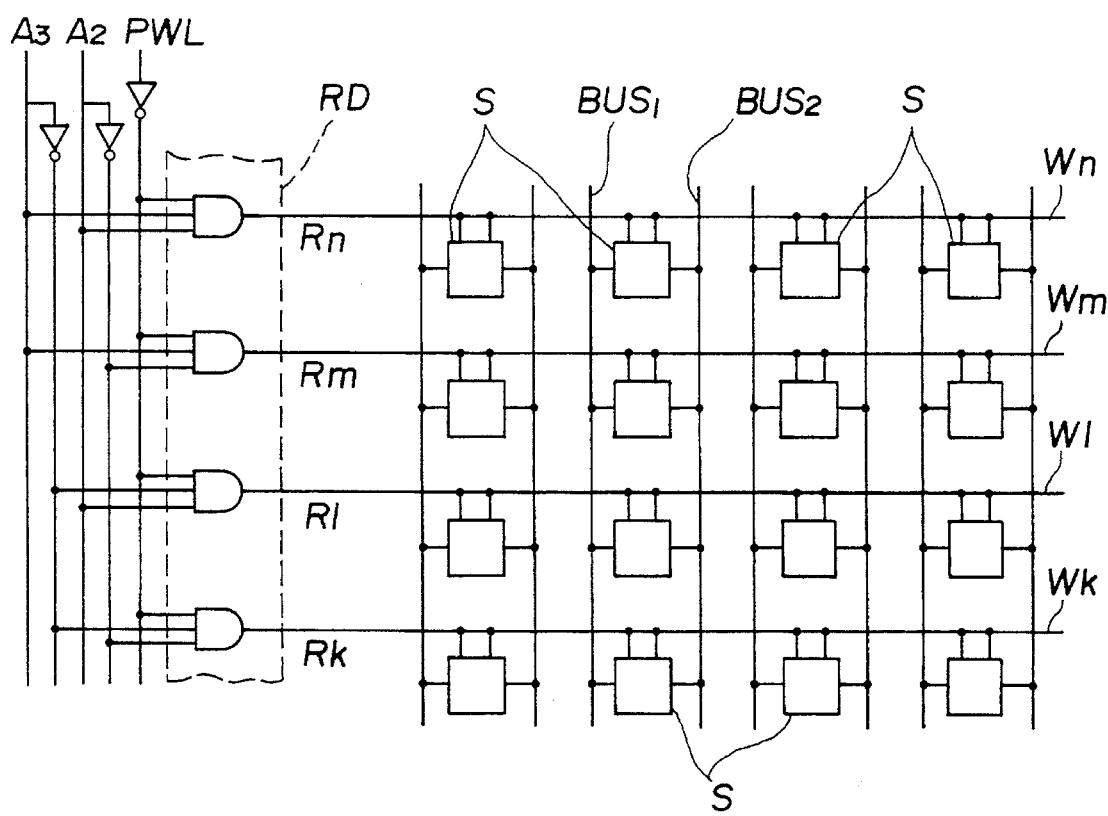
FIG. 1 is a circuit diagram showing a significant portion of a static random access memory to which the invention, is applicable.

With reference to the drawings, and in particular to FIG. 1, there is shown a semiconductor memory device to which this invention is applicable. The semiconductor memory device is in the form of a static random access memory (SRAM) which includes an array of memory cells S. The memory cells S arranged in a row are connected to a corresponding one of word lines Wn, Wm, Wl, Wk, ... The memory cells S arranged in a column are connected to corresponding bit lines BUS1 and BUS2. The SRAM also includes a row decoder RD shown as including gate circuits which receive a PWL pulse signal for producing one or more drive signals Rn, Rm, Rl, Rk, ... for activating corresponding word lines selected by address inputs A2 and A3 applied to the gate circuits.

Figure 2:
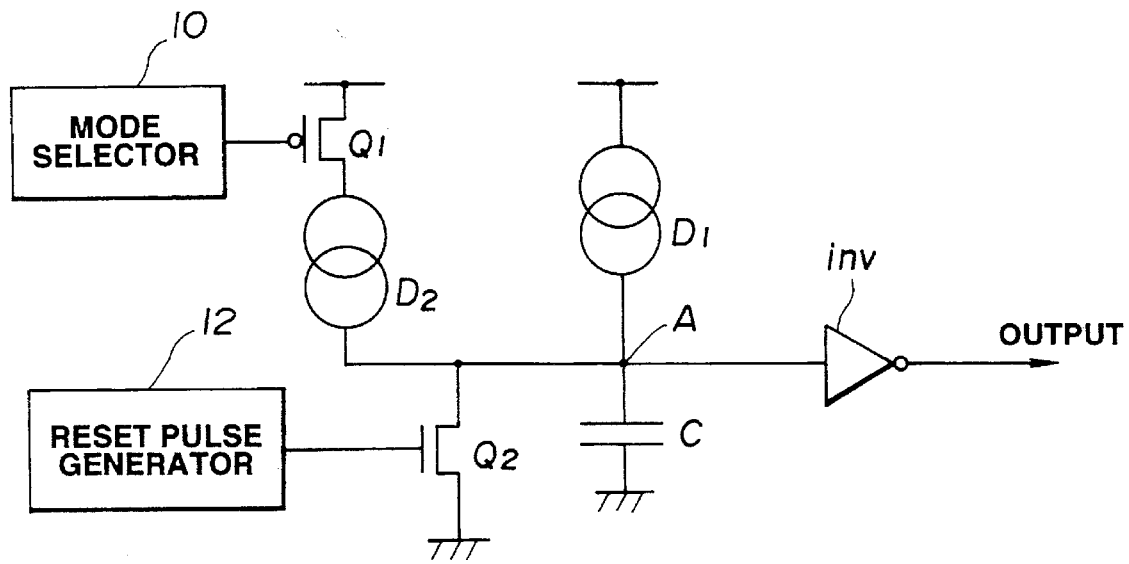
FIG. 2 is a circuit diagram showing one embodiment of a semiconductor memory testing apparatus made in accordance with the invention.

Referring to FIG. 2, there is shown one embodiment of a semiconductor memory testing apparatus made in accordance with the invention. The semiconductor memory testing apparatus includes a PWL timer arranged to produce a PWL pulse signal at its output terminal for activating selected word lines provided in the semiconductor memory device of FIG. 1. The PWL timer includes a constant-current regulated power source D1 through which a voltage source is connected to a node A which, in turn, is connected to the ground through a capacitor C. The node A is connected through an invertor inv to the output terminal. The PWL timer also includes a p-channel transistor Q1 through which a voltage source is connected to a constant-current regulated power source D2 which, in turn, is connected to the node A. The p-channel transistor Q1 has a gate electrode connected to a terminal for receipt of a "H" (high) or "L" (low) level mode selection signal from a mode selector 10. The node A is connected to the ground through an n-channel transistor Q2 which has a gate electrode connected to a terminal for receipt of a reset pulse signal from a reset pulse generator 12. The transistors Q1 and Q2, the constant-current regulated power sources D1 and D2 and the capacitor C form a constant-current regulated power source.

Assuming now that the n-channel transistor Q2 receives a "H" level reset pulse signal at its gate electrode from the reset pulse generator 12, it is connected to discharge the capacitor C so as to change the input of the invertor inv to its "L" level. As a result, the PWL timer produces a "H" level PWL pulse signal at its output terminal. When the reset pulse changes to its "L" level, the capacitor C begins to accumulate charge. When the voltage across the capacitor C exceeds a threshold value, the input of the invertor inv changes to its "H" level. As a result, the PWL pulse signal changes to its "L" level. Therefore, the PWL timer can serve to set the length of time during which the PWL pulse signal remains at the "H" level according to the width of the reset pulse signal.

The mode selection signal is set at its "L" level when the PWL timer is to operate in a testing mode and at its "H" level when the PWL timer is to operate in a using mode. It is now assumed that the mode selection signal applied to the gate electrode of the p-channel transistor Q1 from the mode selector 10 is set at its "L" level to select the testing mode of operation of the PWL timer. When the reset pulse applied to the gate electrode of the n-channel transistor Q2 is at its "H" level, the transistor Q2 is connected to discharge the capacitor C so as to change the input of the invertor inv to the "L" level. As a result, the PWL timer produces a "H" level PWL pulse signal at its output. When the reset pulse changes to its "L" level, the capacitor C begins to accumulate charge. In this case, two constant-current regulated power sources D1 and D2 are connected to charge the capacitor C.

It is now assumed that the mode selection signal applied to the gate electrode of the p-channel transistor Q1 from the mode selector 10 is set at its "H" level to select the using mode of operation of the PWL timer. When the reset pulse applied to the gate electrode of the n-channel transistor Q2 is at its "H" level, the transistor Q2 is connected to discharge the capacitor C so as to change the input of the invertor inv to the "L" level. As a result, the PWL timer produces a "H" level PWL pulse signal at its output. When the reset pulse changes to its "L" level, the capacitor C begins to accumulate charge. In this case, only one constant-current regulated power source D1 is connected to charge the capcitor C. Therefore, the capacitor C is fully charged in a longer time in the using mode than in the testing mode where it is charged by two constant-current regulated power sources D1 and D2.

The PWL timer determines the length of time during which the PWL pulse signal remains at its "H" level. A shorter time is set for the PWL timer in the testing mode than in the using mode. It is, therefore, possible to screen or detect a defective memory cell(s) which require a long time for data reading and/or writing operation during the testing mode of operation of the PWL timer for which a shorter time is set.

Figure 3:
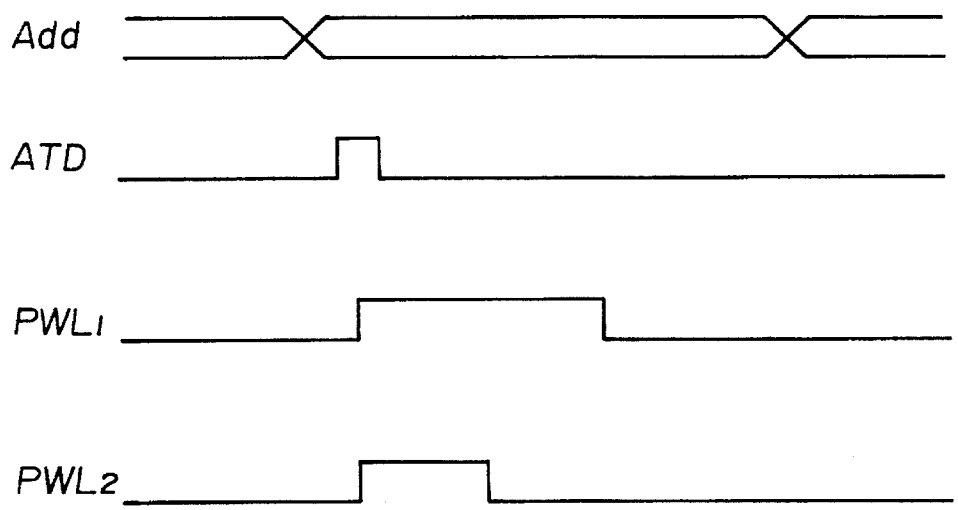
FIG. 3 is a time chart used in explaining the operation of the semiconductor memory testing apparatus of FIG. 2.

The reset pulse signal applied to the gate electrode of the n-channel transistor Q2 from the reset pulse generator 12 may be in the form of an ATD pulse signal produced when an address change is detected. As shown in FIG. 3, an ATD pulse is produced when the address signal (Add) changes. The ATD pulse is used to cause the PWL timer to activate word lines selected in the semiconductor memory device. The period PWL2 of the PWL pulse signal produced in the testing mode is shorter than the period PWL1 of the PWL pulse signal produced in the using mode. Thus, the memory cells are checked under more sever conditions in the testing mode than in the using mode.

While this embodiment has been described in connection with two constant-current regulated sources D1 and D2, it is to be understood that three or more constant-current regulated sources may be used in the PWL timer.

Figure 4:
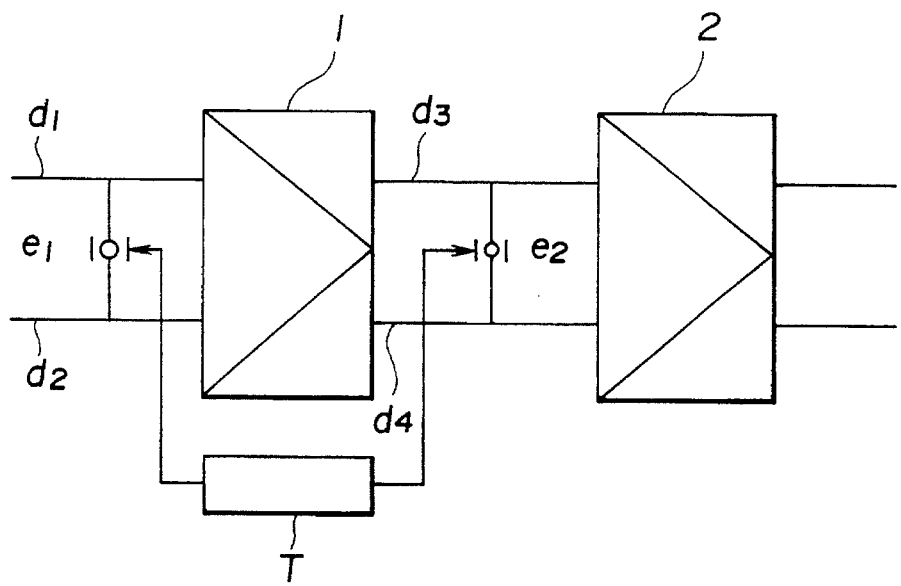
FIG. 4 is a circuit diagram showing a significant portion of a semiconductor memory device to which the invention is applicable.

Referring to FIG. 4, there is shown another semiconductor memory device to which this invention is applicable. The semiconductor memory device includes a first sense amplifier 1 having two input terminals connected to respective local data lines d1 and d2 and two output terminals connected to respective output lines d3 and d4. The local data lines d1 and d2 are connected to a first equalizer e1. The output lines d3 and d4 are connected to a second equalizer e2. The first equalizer e1 responds to a first equalizing signal fed thereto from a timer T by equalizing the data lines d1 and d2. The second equalizer e2 responds to a second equalizing signal fed thereto from the timer T by equalizing the output lines d3 and d4.

Figure 5:
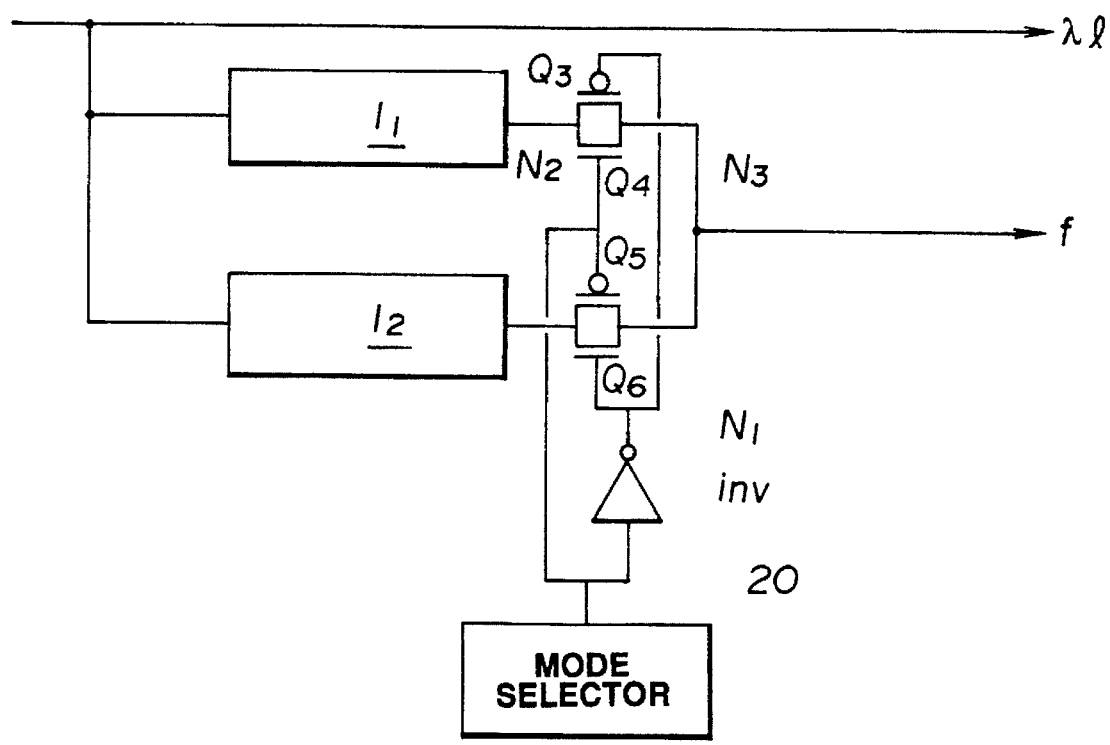
FIG. 5 is a circuit diagram showing a second embodiment of the semiconductor memory testing apparatus of the invention.

Referring to FIG. 5, there is shown a second embodiment of the semiconductor memory testing apparatus of the invention. In the second embodiment, the semiconductor memory testing apparatus includes first and second delay circuits I1 and I2 each of which has an input terminal coupled to the local data line equalizing signal l fed from the timer T to the first equalizer e1. The first delay circuit I1 has an output terminal connected through a p-channel transistor Q3 and an n-channel transistor Q4 to a node N3 from which a sense amplifier output equalizing signal f is produced. The p-channel transistor Q3 has a gate electrode connected to a mode selector 20 through an invertor inv and the n-channel transistor Q4 has a gate electrode connected to the mode selector 20. The second delay circuit I2 has an output terminal connected to the node N3 through a p-channel transistor Q5 and an n-channel transistor Q6. The p-channel transistor Q5 has a gate electrode connected to the mode selector 20 and the n-channel transistor Q6 has a gate electrode connected to the mode selector 20 through the invertor inv.

The mode selector 20 produces a "H" level mode selection signal when a testing mode is required and an "L" level mode selection signal when a using mode is required. When the mode selector 20 is set to produce a "H" level mode selection signal so as to select the testing mode, an "L" level signal appears at the node N1 (the output of the invertor inv), whereas a "H" level signal appears at the node N2. As a result, the first delay circuit I1 is selected to produce the sense amplifier output equalizing signal f in the testing mode. When the mode selector 20 is set to produce an "L" level mode selection signal so as to select the using mode, a "H" level signal appears at the node N1 (the output of the invertor inv), whereas an "L" level signal appears at the node N2. As a result, the second delay circuit I2 is selected to produce the sense amplifier output equalizing signal f in the using mode. In order to provide more sever equalizing release timing in the testing mode, a shorter delay time is set for the first delay circuit I1 than for the second delay circuit I2. This is effective to detect a device(s) which requires a long access time.

While this embodiment has been described in connection with two delay circuits I1 and I2, it is to be understood that three or more delay circuits may be used in the circuit.

Figure 6:
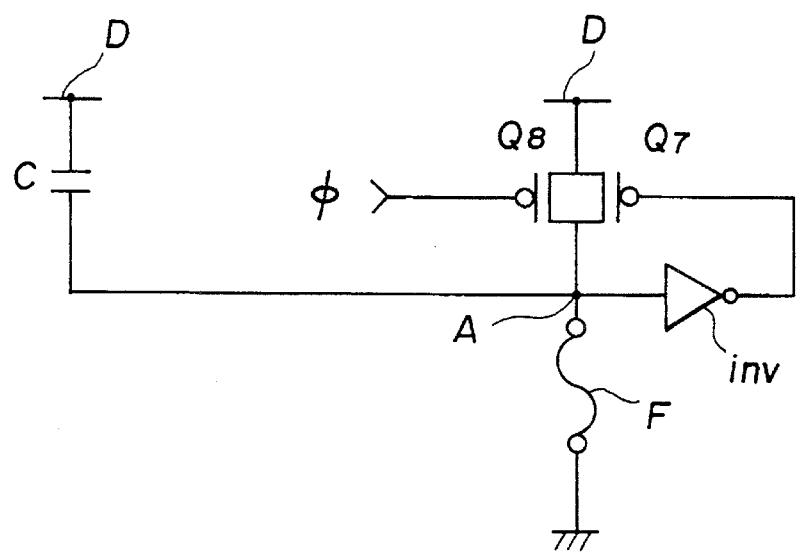
FIG. 6 is a circuit diagram showing a third embodiment of the semi conductor memory testing apparatus of the invention.

Referring to FIG. 6, there is shown a third embodiment of the semi conductor memory testing apparatus of the invention. The memory cell includes a voltage source D connected through a capacitor C to a node A which, in turn, is connected to the ground through a fuse F. The node A is connected through p-channel transistors Q7 and Q7 to the voltage source D. The p-channel transistor Q7 has a gate electrode connected through an invertor inv to the node A.

The p-channel transistor Q8 has a gate electrode connected to a terminal for receipt of a reset pulse Φ.

When the testing mode is selected, no reset pulse is applied to the gate electrode of the p-channel transistor Q8. As a result, the voltage from the voltage source raises at a slow rate so as to reduce the effect of the capacitor C. It is, therefore, possible to detect leakage in the broken fuse F with ease.

While this invention has been described in connection with specific embodiments thereof, it is evident that many alternatives, modifications and variations will be apparent to those skilled in the art. Accordingly, it is intended to embrace all alternatives, modifications and variations that fall within the scope of the appended claims.

What is claimed is:

1. A memory device comprising:

a memory cell for storing data;

a word line related to said memory cell;

a timer defining an active period of said word line, said active period having two predetermined durations;

further comprising a mode selector for selecting one of using and testing modes, said mode selector being connected to said timer for selecting one of said two predetermined durations; and wherein said timer defines a first active period duration in the using mode and a second active period duration in the testing mode, the second active period duration being shorter than the first active period.

* * * * *